United States Patent
Fest

(10) Patent No.: US 11,088,024 B2
(45) Date of Patent: Aug. 10, 2021

(54) FORMING A THIN FILM RESISTOR (TFR) IN AN INTEGRATED CIRCUIT DEVICE

(71) Applicant: Microchip Technology Incorporated, Chandler, AZ (US)

(72) Inventor: Paul Fest, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/450,391

(22) Filed: Jun. 24, 2019

(65) Prior Publication Data
US 2020/0328115 A1 Oct. 15, 2020

Related U.S. Application Data

(60) Provisional application No. 62/832,290, filed on Apr. 11, 2019.

(51) Int. Cl.
*H01L 21/768* (2006.01)
*H01L 21/311* (2006.01)
*H01L 49/02* (2006.01)

(52) U.S. Cl.
CPC .. *H01L 21/76895* (2013.01); *H01L 21/31144* (2013.01); *H01L 21/76834* (2013.01); *H01L 28/20* (2013.01)

(58) Field of Classification Search
CPC ... H01L 27/2463; H01L 45/08; H01L 45/085; H01L 45/1273; H01L 45/142; H01L 45/144; H01L 45/145; H01L 45/146; H01L 45/16; H01L 21/76895; H01L 21/76834; H01L 21/31144; H01L 28/20
See application file for complete search history.

(56) References Cited

U.S. PATENT DOCUMENTS

| | | | | |
|---|---|---|---|---|
| 7,214,990 B1 * | 5/2007 | Lee | ...................... | H01L 27/016 257/368 |
| 2003/0011043 A1 | 1/2003 | Roberts | ........................ | 257/532 |
| 2003/0011049 A1 * | 1/2003 | Nuytkens | ............. | C23C 18/1858 257/666 |
| 2006/0181388 A1 * | 8/2006 | Chinthakindi | ...... | H01L 27/0629 338/309 |

(Continued)

OTHER PUBLICATIONS

International Search Report and Written Opinion, Application No. PCT/US2019/055765, 14 pages, dated Jan. 23, 2020.

*Primary Examiner* — Robert G Bachner
(74) *Attorney, Agent, or Firm* — Slayden Grubert Beard PLLC

(57) ABSTRACT

A method is provided for forming a thin film resistor (TFR) in an integrated circuit (IC) including IC elements, e.g., memory components. A first contact etch stop layer is formed over the IC elements. A TFR layer stack including a TFR etch stop layer, a TFR film layer, and a second contact etch stop layer is formed over the first contact etch stop layer, and in some cases over one or more pre-metal dielectric layers. A patterned mask is formed over the IC stack, and the stack is etched, through both the first and second contact etch stop layers, to simultaneously form (a) first contact openings exposing contact regions of the IC elements and (b) second contact opening(s) exposing the TFR film layer. The first and second contact openings are filled with conductive material to form conductive contacts to the IC elements and the TFR film layer.

19 Claims, 14 Drawing Sheets

(56) References Cited

U.S. PATENT DOCUMENTS

2010/0213602 A1* 8/2010 Smeys .............. H01L 23/49816
   257/698
2015/0187632 A1* 7/2015 Ali .......................... H01L 28/24
   257/537

* cited by examiner

FORMING A THIN FILM RESISTOR (TFR) IN AN INTEGRATED CIRCUIT DEVICE

PRIORITY

This application claims priority to U.S. Provisional Patent Application No. 62/832,290 filed Apr. 11, 2019, the contents of which are hereby incorporated in their entirety.

TECHNICAL FIELD

The present disclosure relates to thin film resistors (TFR) and a method of forming thin film resistors, e.g., systems and methods for forming a thin film resistor integrated in a semiconductor integrated circuit (IC) device.

BACKGROUND

Many integrated circuit ("IC") devices incorporate thin film resistors (TFRs), which provide various advantages over other types of resistors. For example, TFRs may be highly accurate, and may be finely tuned to provide a very precise resistance value. In addition, TFRs typically have a low temperature coefficient of resistance (TCR), e.g., after a suitable annealing process to "tune" the TCR to a near-zero value, which may provide stable operation over a wide range of operating temperatures. Further, TFRs typical have smaller parasitic components which provides advantageous high frequency behavior. A TFR may include any suitable metallic film formed on, or in, an insulating substrate. Some common IC-integrated TFR materials include SiCr, SiCCr, TaN, and TiN, although any other suitable materials may be used. One common drawback of thin film resistors is that their fabrication typically requires additional processing steps, including multiple additional masking steps. For example, at least two mask steps are typically required to integrate a TFR into a process that uses AlCu as the backend interconnect.

SUMMARY

Embodiments of the present invention provide an improved technique for integrating a thin film resistor (TFR) in a semiconductor integrated circuit (IC) device, which may provide a cost reduction as compared with conventional techniques. For example, some embodiments provide methods and systems for forming an integrated TFR using a single photomask process, as compared with conventional methods that require at least two mask processes.

One embodiment provides a method of forming an integrated circuit (IC) structure including a thin film resistor (TFR). At least one IC element (e.g., transistors or memory components) may be formed over a semiconductor substrate, the IC element(s) having associated IC element contact region(s). A first contact etch stop layer may be formed over the IC element(s). A TFR layer stack may be formed above the first contact etch stop layer (e.g., directly over the first contact etch stop layer, or over one or more dielectric layers formed over the first contact etch stop layer) and laterally offset from the IC element contact region(s). The TFR layer stack may include a TFR etch stop layer, a TFR film over the TFR etch stop layer, and a second contact etch stop layer over the TFR film. At least one dielectric layer may be formed above or below the TFR layer stack, i.e., before, or after, forming the TFR layer stack. A patterned mask may be formed, including first mask opening(s) aligned over the IC element contact region(s) and second mask opening(s) aligned over the TFR layer stack. At least one etch may then be performed through the first and second mask openings and through portions of the IC structure, including through both the first contact etch stop layer and the second contact etch stop layer, to simultaneously form (a) first contact opening(s) that exposes the IC element contact region(s) and (a) second contact opening(s) that exposes the TFR film. The first and second contact openings may be filled with conductive material to form conductive contacts to the IC elements and conductive contacts to the TFR film.

Another embodiment provides a method of forming a thin film resistor (TFR), including forming a conductive contact region over a semiconductor substrate, forming a first contact etch stop layer above the conductive contact region; forming a TFR film above the first contact etch stop layer, and forming a second contact etch stop layer over the TFR film, wherein the TFR film and the second contact etch stop layer are laterally offset from the contact pad. A photomask is formed and patterned with a first mask opening aligned over the conductive contact region and at least one second mask opening aligned over the TFR film. At least one etch may be performed through the first and second mask openings and through both the first contact etch stop layer and the second contact etch stop layer to form both (a) a first contact opening that exposes the conductive contact region and (a) at least one second contact opening that exposes the TFR film. The first and second contact openings may be filled with conductive material to form vertically-extending contacts to the conductive contact region and to the TFR film.

Another embodiment provides an integrated circuit (IC) structure including at least one IC element located over a semiconductor substrate, the at least one IC element having at least one IC element contact region; a first contact etch stop layer over the at least one IC element; and a thin film resistor (TFR) over the first contact etch stop layer and laterally offset from the at least one IC element contact region. The TFR layer stack may include a TFR film layer and a second contact etch stop layer over the TFR film layer. A first lateral edge of the second contact etch stop layer is laterally coincident with a first lateral edge of the TFR film layer below the second contact etch stop layer. In some embodiments, the first lateral edge of the second contact etch stop layer and the first lateral edge of the underlying TFR film layer are laterally coincident as a result of a mask and etch process performed on the TFR layer stack. In some embodiments, a second lateral edge of the second contact etch stop layer is laterally coincident with a second lateral edge of the TFR film layer, e.g., as a result of a mask and etch process performed on the TFR layer stack. The IC structure may also include at least one conductive contact extending down to the TFR film layer, thereby defining a TFR in the IC structure, and at least one conductive contact laterally offset from the TFR and extending down to the at least one IC element.

Embodiments of the present invention may provide one or more benefits over known multiple-photomask TFR integration processes, including for example, reduced cost, reduced cycle time, and/or reduced defects in the integrated TFR.

Some embodiments utilize differences in etch selectivity between different layers in an IC stack to allow for the insertion of a TFR within a pre-metal dielectric region using only a single photomask. In particular, an etch-resistant layer may be provided directly above a TFR film formed in an IC stack to control a subsequent contact etch (an etch process for forming contact trenches or vias) such that the contact etch exposes both the TFR film and contact pads of IC elements (e.g., transistor or memory components) substantially simultaneously. Thus, a single etch process (and thus a single mask) can be used to form both (a) TFR contacts and (b) contact(s) to underlying IC elements. For example, using the fact that nitride generally etches much slower than oxide for contact etch processes, a nitride layer (e.g., SiN) may be provided directly above the TFR film to slow the contact etch over the TFR film while the contact etch continues at its regular etch rate in areas where the nitride layer is not present, such that the contact etch reaches the TFR film and IC element contact pads simultaneously. Thus, the nitride layer formed over the TFR film acts as a "hard mask," which is not contemplated in conventional TFR formation techniques

BRIEF DESCRIPTION OF THE DRAWINGS

Example aspects of the present disclosure are described below in conjunction with the figures, in which.

Figure 1A:
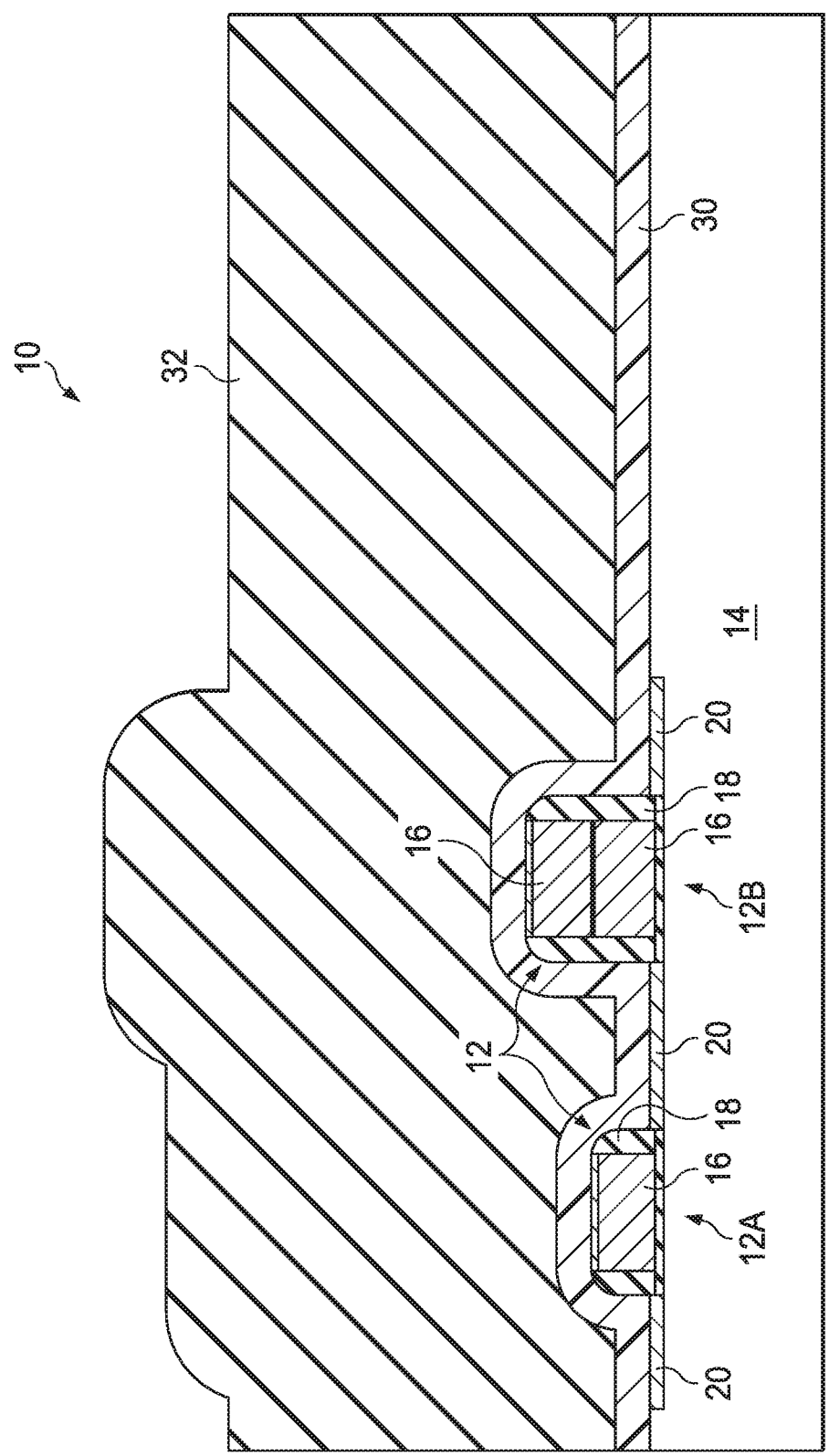
FIGS. 1A-1L illustrate an example method of integrating a thin film resistor (TFR) in a semiconductor integrated circuit (IC) device, according to an example embodiment of the invention.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

As discussed above, embodiments of the present invention provide an improved technique for integrating a thin film resistor (TFR) in a semiconductor integrated circuit (IC) device, which may provide a cost reduction as compared with conventional techniques. For example, some embodiments provide methods and systems for forming an integrated TFR using a single photomask process, as compared with conventional methods that require at least two mask processes.

A first aspect of the invention provides a method of forming an integrated circuit (IC) structure including a thin film resistor (TFR). The method may include forming at least one IC element over a semiconductor substrate, the at least one IC element having at least one IC element contact region; forming a first contact etch stop layer over the at least one IC element; and forming a TFR layer stack above the first contact etch stop layer and laterally offset from the at least one IC element contact region. Forming the TFR layer stack may include: forming a TFR etch stop layer, forming a TFR film over the TFR etch stop layer, and forming a second contact etch stop layer over the TFR film. At least one dielectric layer may be formed above or below the TFR layer stack, i.e., before or after forming the TFR layer stack. A patterned mask may be formed, including at least one first mask opening aligned over the at least one IC element contact region and at least one second mask opening aligned over the TFR layer stack. At least one etch may then be performed through the first and second mask openings and through portions of the IC structure, including through both the first contact etch stop layer and the second contact etch stop layer, to simultaneously form (a) at least one first contact opening that exposes the at least one IC element contact region and (a) at least one second contact opening that exposes the TFR film. The first and second contact openings may be filled with conductive material to form at least one conductive contact to the at least one IC element and at least one conductive contact to the TFR film.

In some embodiments, one or multiple dielectric layers may be deposited over the at least one IC element and over the first contact etch stop layer, and the TFR layer stack may be formed over such dielectric layer(s). Further, at least one dielectric layer may be deposited over the TFR layer stack.

In some embodiments, the TFR layer stack may be formed directly on the first contact etch stop layer.

In some embodiments, the first contact etch stop layer and the second contact etch stop layer are formed from the same material. For example, the first contact etch stop layer and the second contact etch stop layer may both comprise SiN layers. In other embodiments, the first contact etch stop layer and the second contact etch stop layer may be formed from different material. For example, the first contact etch stop layer or second contact etch stop layer may comprise SiN, while the other may comprise SiC or SiON. In some embodiments, the second contact etch stop layer has a greater thickness than the first contact etch stop layer.

In some embodiments, performing at least one etch to simultaneously form (a) at least one first contact opening that exposes the IC element contact region and (a) at least one second contact opening that exposes the TFR film may include: (a) performing a first etch that stops at the first contact etch stop layer and the second contact etch stop layer; and (b) performing a second etch that extends through the first contact etch stop layer and second contact etch stop layer to expose the at least one IC element contact region and the TFR film.

Another aspect of the invention provides a method of forming a thin film resistor (TFR), including forming a conductive contact region over a semiconductor substrate; forming a first contact etch stop layer above the conductive contact region; forming a TFR film above the first contact etch stop layer; and forming a second contact etch stop layer over the TFR film, wherein the TFR film and the second contact etch stop layer are laterally offset from the contact pad. The method may further include forming a patterned mask having a first mask opening aligned over the conductive contact region and at least one second mask opening aligned over the TFR film; performing at least one etch through the first and second mask openings and through both the first contact etch stop layer and the second contact etch stop layer to form both (a) a first contact opening that exposes the conductive contact region and (a) at least one second contact opening that exposes the TFR film; and filling the first contact opening and the at least one second contact opening with conductive material to form vertically-extending contacts to the conductive contact region and to the TFR film.

In some embodiments, the method may include forming an IC element over the semiconductor substrate, wherein the conductive contact region provides a conductive coupling to the IC element; depositing at least one dielectric layer over the IC element, the conductive contact region, and the first contact etch stop layer; and forming the TFR film over the at least one dielectric layer.

In some embodiments, the method may include forming a TFR layer stack directly on the first contact etch stop layer by forming a TFR etch stop layer directly on the first contact etch stop layer; forming the TFR film over the TFR etch stop layer; and forming the second contact etch stop layer over the TFR film.

Another aspect of the invention provides an integrated circuit (IC) structure including at least one IC element located over a semiconductor substrate, the at least one IC element having at least one IC element contact region; a first contact etch stop layer over the at least one IC element; and a thin film resistor (TFR) over the first contact etch stop layer and laterally offset from the at least one IC element contact region. The TFR layer stack may include a TFR film layer and a second contact etch stop layer over the TFR film layer. A lateral edge of the second contact etch stop layer is laterally coincident with a lateral edge of the TFR film layer below the second contact etch stop layer. In some embodiments, the lateral edge of the second contact etch stop layer and the lateral edge of the underlying TFR film layer are laterally coincident as a result of a mask and vertical etch process performed on the TFR layer stack. The IC structure may also include at least one conductive contact extending down to the TFR film layer, thereby defining a TFR in the IC structure, and at least one conductive contact laterally offset from the TFR and extending down to the at least one IC element.

In some embodiments, the IC structure also includes at least one dielectric layer above the first contact etch stop layer and below the TFR layer stack.

In some embodiments, the TFR further includes a TFR etch stop layer below the TFR film layer. In some embodiments, a lateral edge of the TFR etch stop layer may be laterally coincident with the lateral edge of the TFR film layer and the lateral edge of the second contact etch stop layer. In some embodiments, the lateral edges of the second contact etch stop layer, the TFR film layer, and the TFR etch stop layer are laterally coincident with each other as a result of a mask and vertical etch process performed on the TFR layer stack.

FIGS. 1A-1L illustrate an example method of integrating a thin film resistor (TFR) in a semiconductor integrated circuit (IC) device, according to an example embodiment.

FIG. 1A illustrates an example integrated circuit (IC) structure 10, e.g., during the manufacturing of a chip or other device including any number of IC elements or components 12, e.g., memory cells, transistors, gates (e.g., floating gates, control gates, erase gates), word lines, bit lines, conductive contacts, vias, or other metal lines, without limitation on a substrate 14. Memory cells, transistors or gates are collectively known as active elements. In this example, the illustrated portion of the IC structure includes floating gate memory elements 12A and 12B of an EEPROM or flash memory cell. IC elements 12A and 12B may include programmable layer structures 16 (e.g., gates) and a dielectric spacer layer 18 formed on the sidewall of the programmable layer structures 16. A silicide layer may define silicide contact pads 20 for IC elements 12A and 12B, or conductive coupling of IC elements 12A and 12B to later-formed conductive contacts (see, e.g., FIGS. 1K and 1L discussed below), e.g., to apply selected voltages to IC elements 12A and 12B.

FIG. 1A may represent a state during an IC fabrication process after formation of the memory cell elements 12A and 12B and deposition of a first contact etch stop layer 30 followed by a first dielectric layer 32 over the elements 12A and 12B. In one embodiment, first contact etch stop layer 30 may comprise a self-aligned contact (SAC) SiN layer, and first dielectric layer 32 may comprise a high-density plasma (HDP) pre-metal dielectric (PMD) oxide.

Figure 1B:
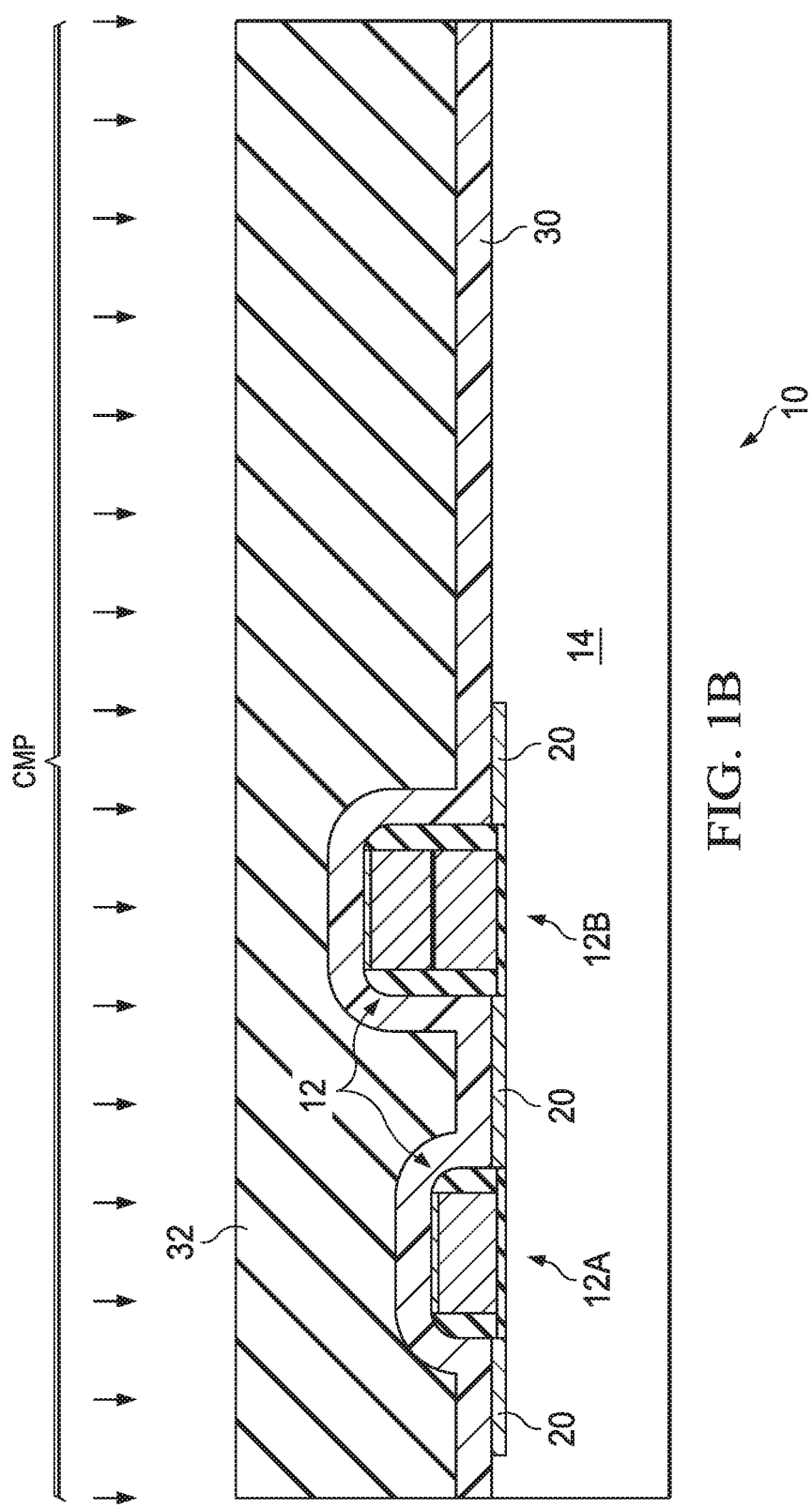

As shown in FIG. 1B, a CMP process may be performed to planarize a top surface of the first dielectric layer 32. In some embodiments, a rapid thermal processing (RTP) anneal may be performed to further stabilize the first dielectric layer 32.

Figure 1C:
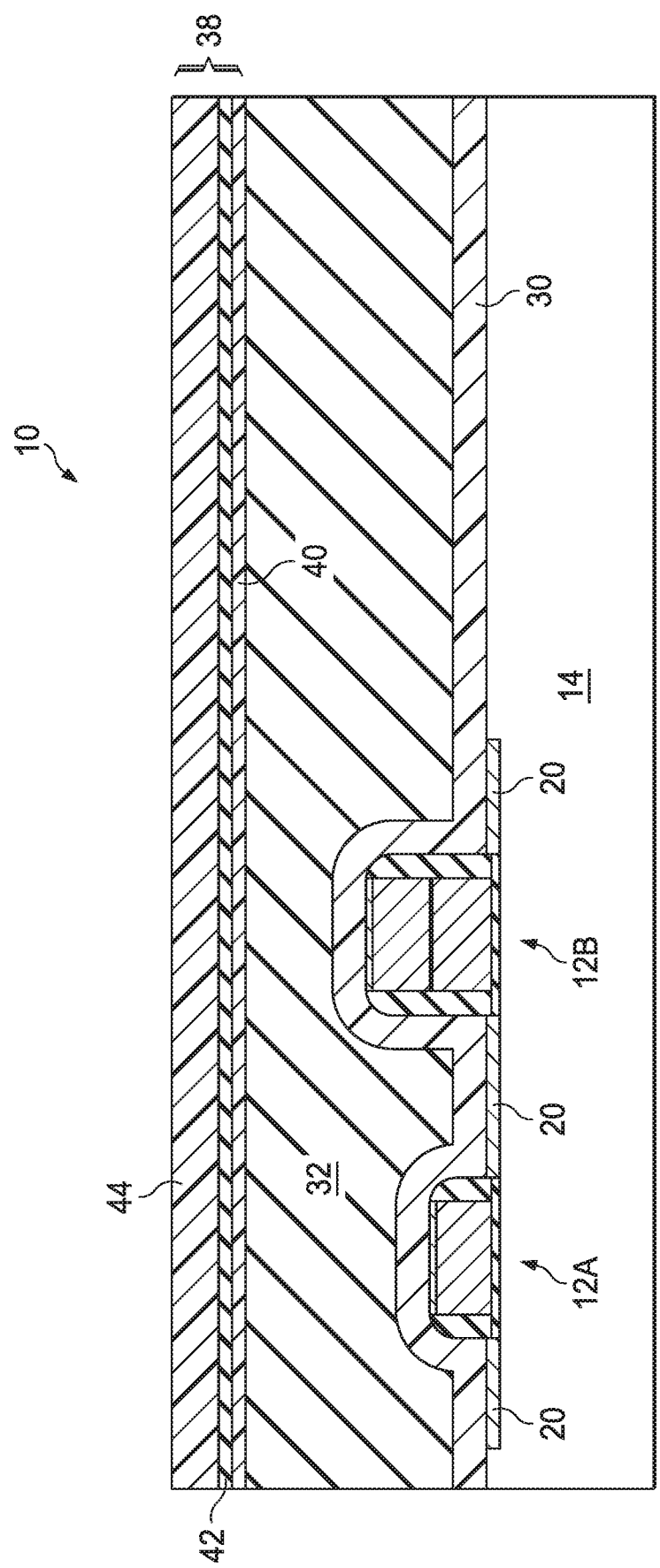

As shown in FIG. 1C, a TFR layer stack 38 may be deposited over the first dielectric layer 32. For example, a TFR film layer 42 (e.g., SiCCr, SiCr, TaN, TiN, or any other suitable TFR film material) may be deposited between a pair of etch stop layers, illustrated as a lower TFR etch stop layer 40 (e.g., SiN) and a second contact etch stop layer 44 (e.g., SiN). In some embodiments, an anneal may be performed, e.g., prior to (or after) depositing the second contact etch stop layer 44, to tune or optimize a temperature coefficient of the TFR film layer 42.

The lower TFR etch stop layer 40 may be optional, depending on the particular embodiment. Thus, some embodiments may exclude the lower TFR etch stop layer 40, such that the TFR layer stack 38 includes only a TFR film layer 42 and overlying second contact etch stop layer 44.

The second contact etch stop layer 44 may be configured to act as a TFR hard mask. The thickness of second contact etch stop layer 44 may be selected or tuned to provide desired etch results in a subsequent etch process, discussed below with reference to FIGS. 1J and 1K. For example, the thickness of second contact etch stop layer 44 may be selected based on (a) the etch selectivity of the second contact etch stop layer 44 relative to one or more underlying layers, in this example the lower TFR etch stop layer 40 and the first dielectric layer 32, and/or (b) the thickness of the second contact etch stop layer 44 layer relative to the thickness of one or more underlying layers, as these thicknesses generally affect the etch rate through each respective layer.

In one example embodiment, forming the TFR layer stack 38 includes depositing a 325 Å SiN lower TFR etch stop layer 40, depositing a 225 Å SiCCr TFR film layer 42, annealing the SiCCr film layer 42 at 515° C. for 30 minutes to optimize the temperature coefficient of the TFR film layer 42, and finally depositing ~1,000 Å (e.g., 500 Å-1,500 Å) SiN second contact etch stop layer 44, which acts as a hard mask during the etch performed in FIG. 1J, discussed below.

Figure 1D:
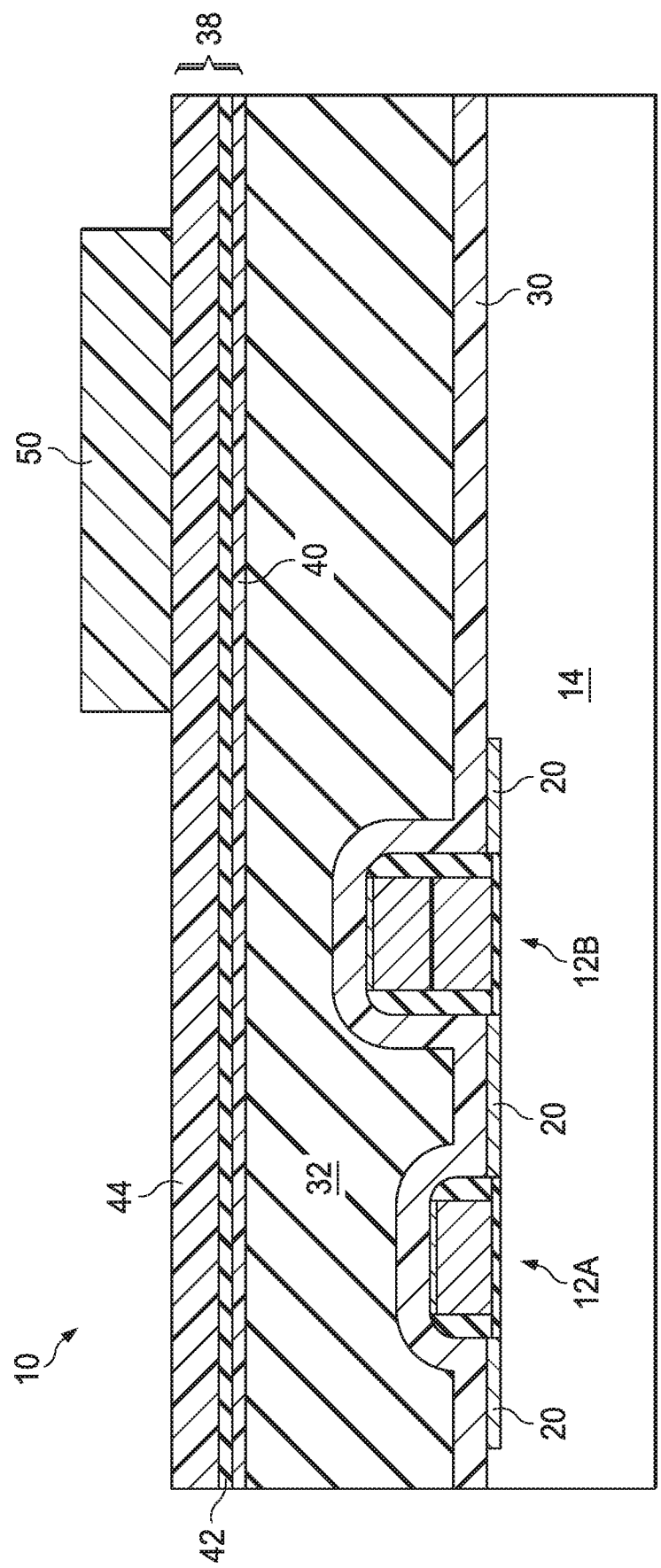

As shown in FIG. 1D, a photoresist 50 may be deposited and patterned over the TFR layer stack 38, at a desired location for the TFR being formed. As shown, photoresist 50 may be patterned at a location laterally offset from the silicide contact pads 20, in order to form a TFR that is laterally offset from the silicide contact pads 20, thus allowing for the simultaneous formation of contacts extending down to silicide contact pads 20 and contacts extending down to the TFR, as discussed below.

Figure 1E:
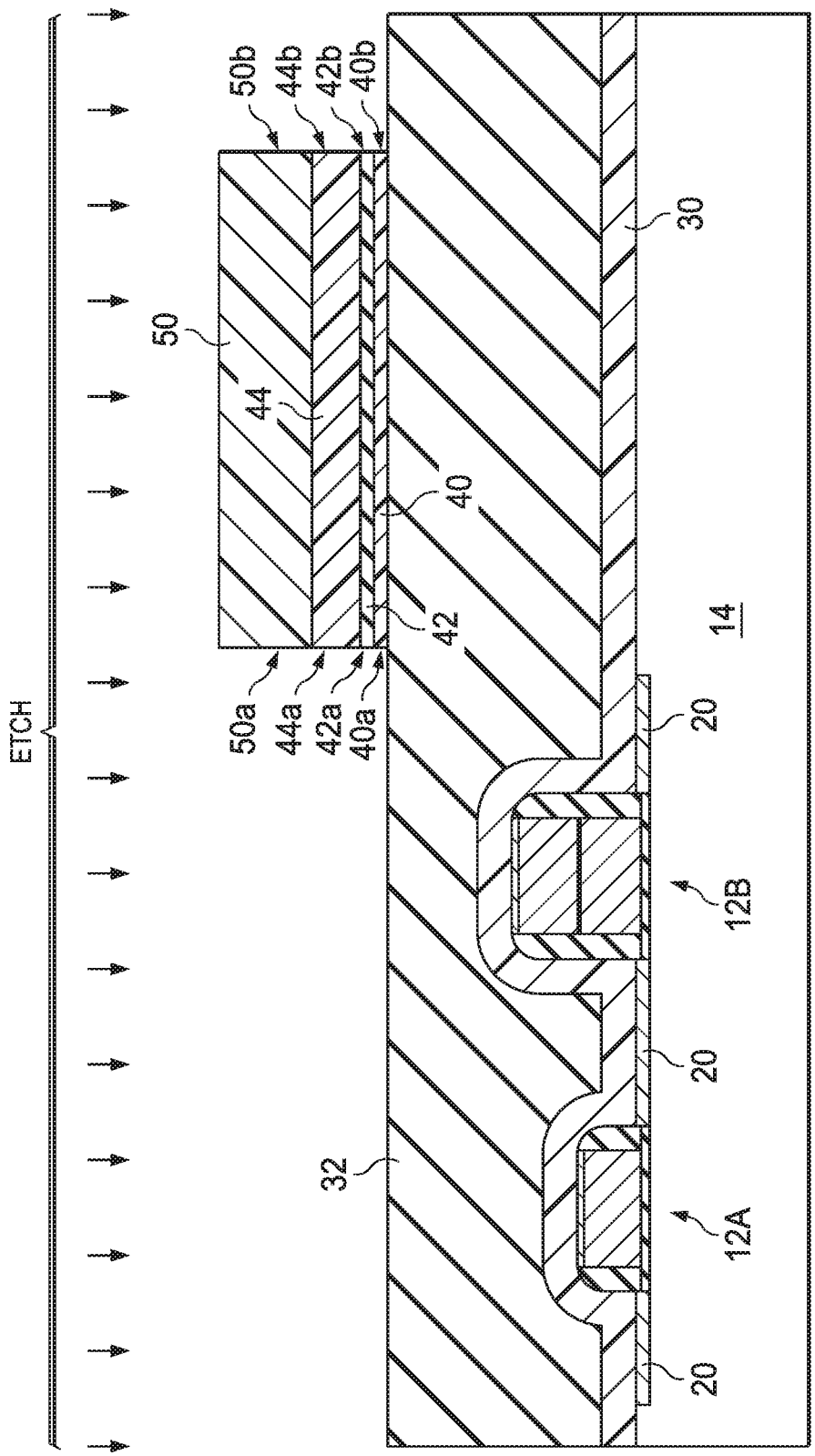

As shown in FIG. 1E, the constituent layers of TFR layer stack 38, i.e. optional lower TFR etch stop layer 40, TFR film layer 42 and second contact etch stop layer 44, outside the area of the photoresist 50 may then be etched by a TFR etch process. In one embodiment the TFR etch process is a two-step etch, including (a) a first etch to remove the second contact etch stop layer 44 and TFR film layer 42, and stopping on the lower TFR etch stop layer 40 (e.g., due to etch selectivity of the relevant layers), followed by (a) a second etch, using a different etch chemistry than the first etch, to clear the lower TFR etch stop layer 40, with photoresist 50 remaining over the remaining portions of the TFR layer stack 38. The TFR etch process may define at least one lateral edge of the second contact etch stop layer 44, the TFR film layer 42, and the lower TFR etch stop layer 40, based on the lateral extent of the photomask 50. For example, as shown in FIG. 1E, the TFR etch process may define (a) first lateral edges 44*a*, 42*a*, and 40*a* (of second contact etch stop layer 44, TFR film layer 42, and lower TFR etch stop layer 40, respectively) that are self-aligned by a first lateral edge 50*a* of the photomask 50, and thus coincident with each other, and (b) second lateral edges 44*b*, 42*b*, and 40*b* (of second contact etch stop layer 44, TFR film layer 42, and lower TFR etch stop layer 40, respectively) that are self-aligned by a second lateral edge 50*b* of the photomask 50, and thus coincident with each other. In such embodiments, the first lateral edges 44*a*, 42*a*, and 40*a* and second lateral edges 44*b*, 42*b*, and 40*b* may be referred to as etch-defined lateral edges, which may be structurally distinguishable from lateral edges defined in other manners.

Figure 1F:
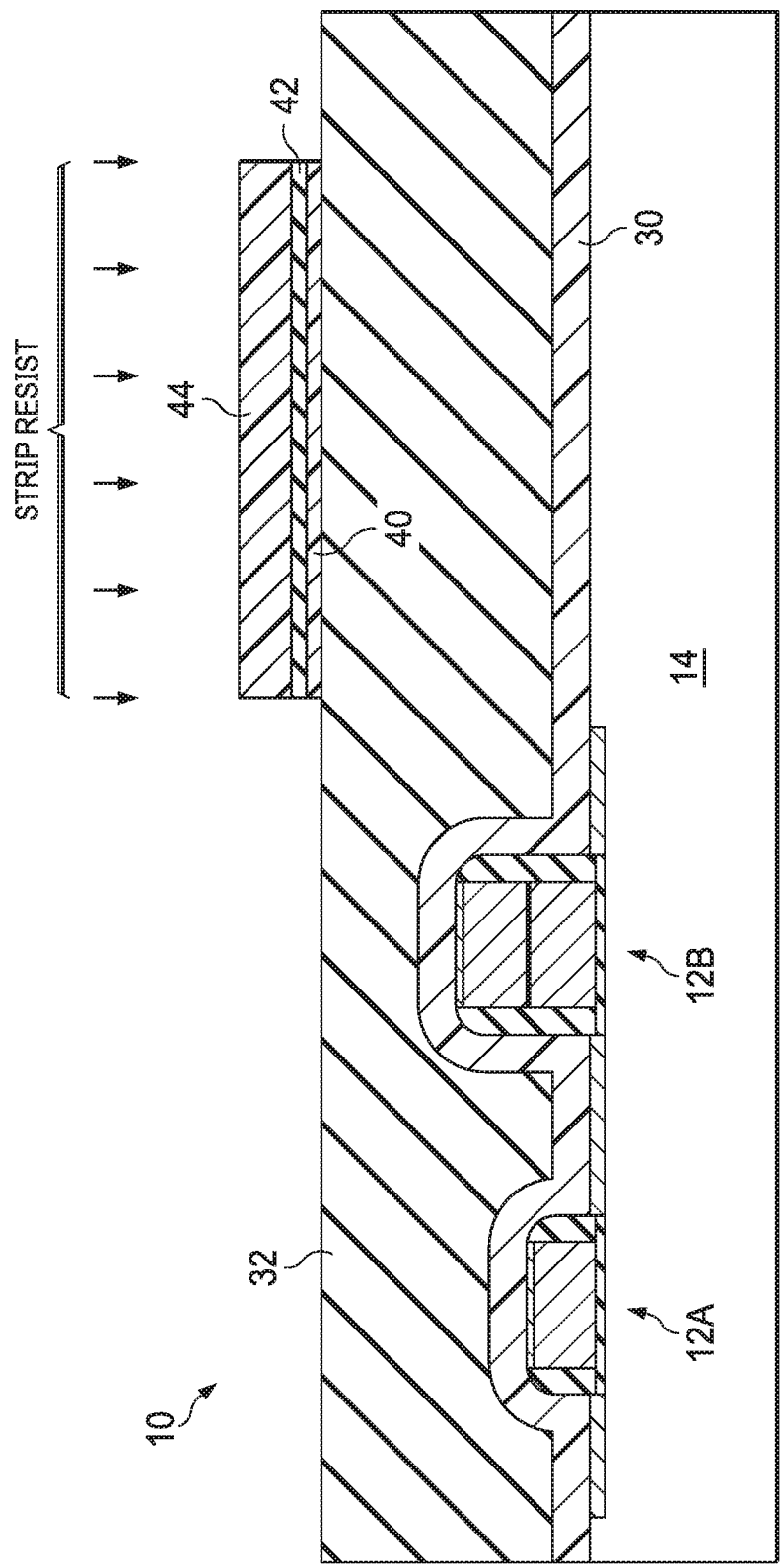

As shown in FIG. 1F, the remaining photoresist 50 may then be removed, e.g., using a resist strip/ash process.

Figure 1G:
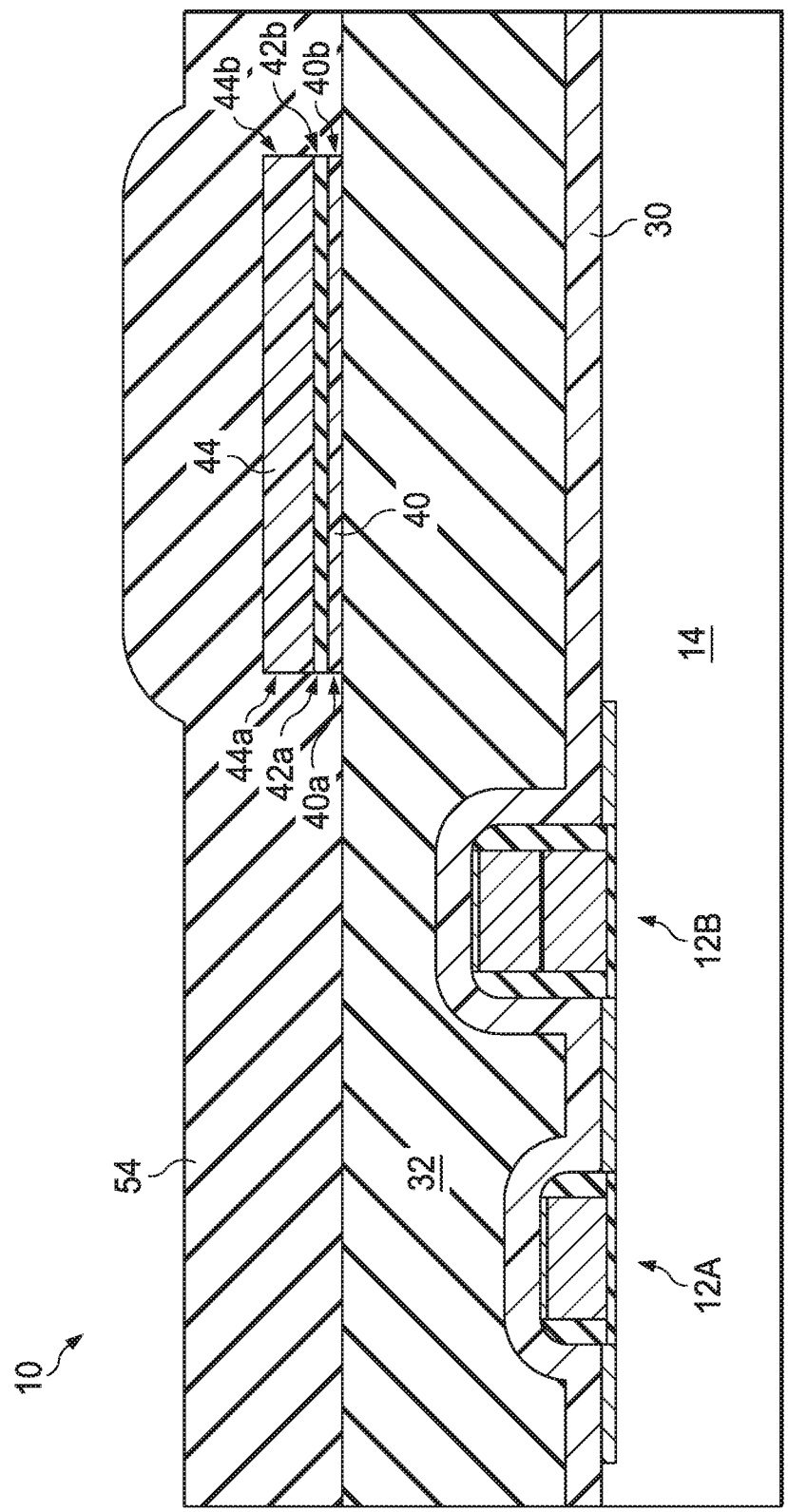

As shown in FIG. 1G, a second dielectric layer 54 may be deposited over the structure. In some embodiments, the second dielectric layer 54 may comprise Pre-Metal Dielectric (PMD) oxide, e.g., for example, PMD P TEOS (phosphorous-doped tetraethyl orthosilicate film). As shown, the deposited second dielectric layer 54 may cover the first and second lateral edges 44*a*/44*b*, 42*a*/42*b*, and 40*a*/40*b* of second contact etch stop layer 44, TFR film layer 42, and lower TFR etch stop layer 40, respectively.

Figure 1H:
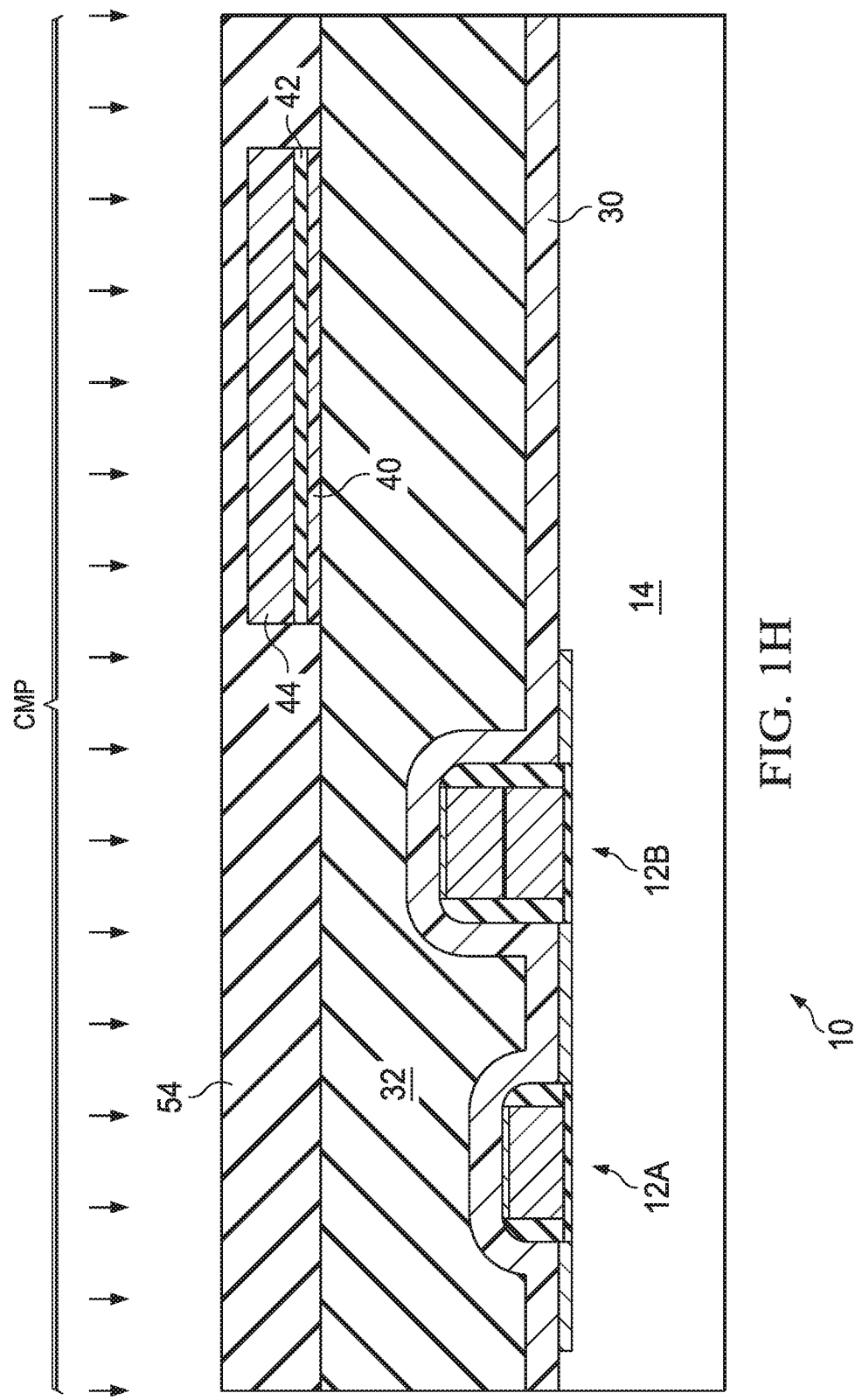

As shown in FIG. 1H, a CMP process may be performed to planarize a top surface of the second dielectric layer 54.

Figure 1I:
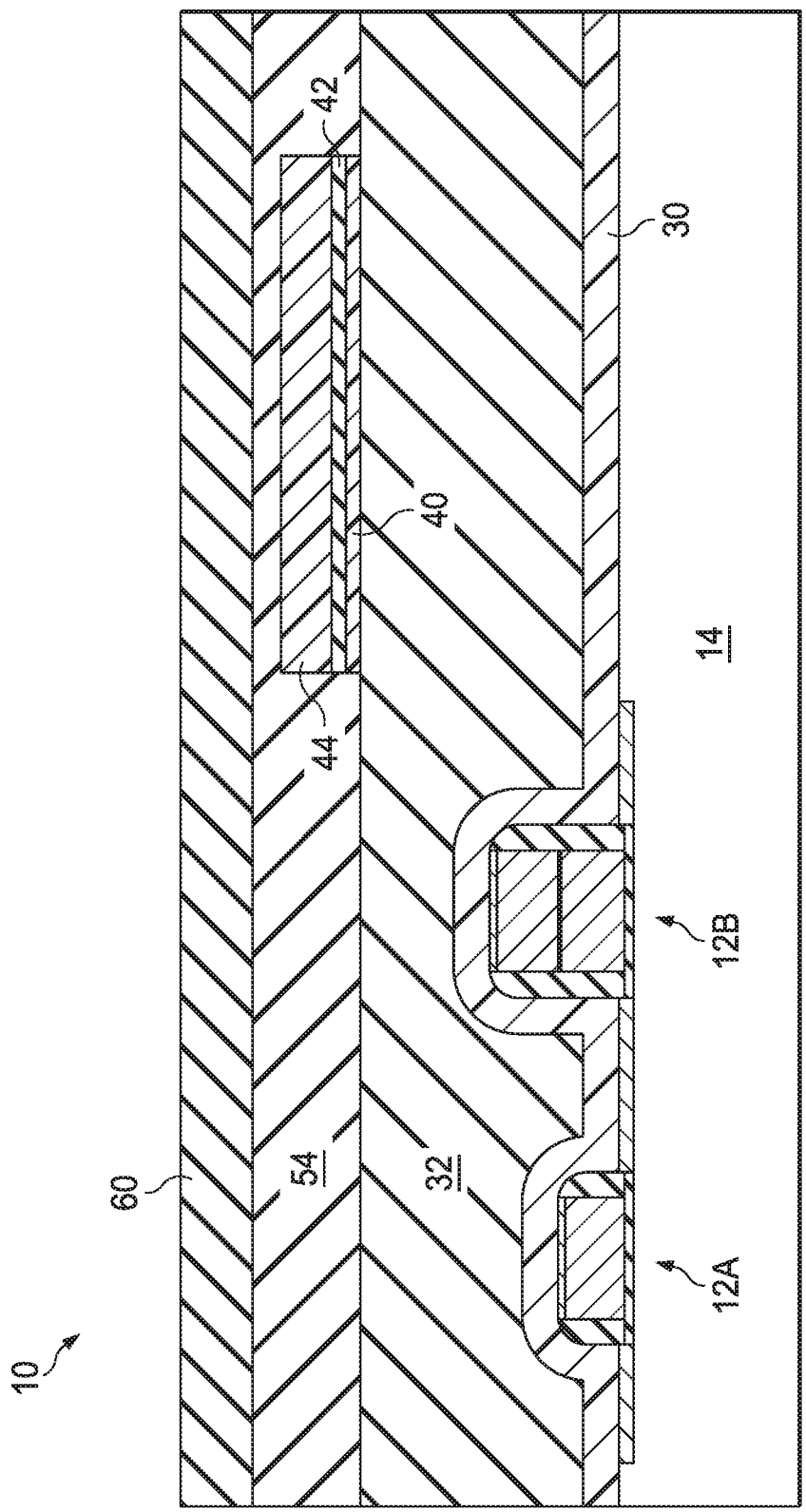

As shown in FIG. 1I, a third dielectric layer 60, e.g., a PMD oxide cap layer, may be deposited over the planarized top surface of the second dielectric layer 54. This step may be optional, depending on the particular embodiment.

Figure 1J:
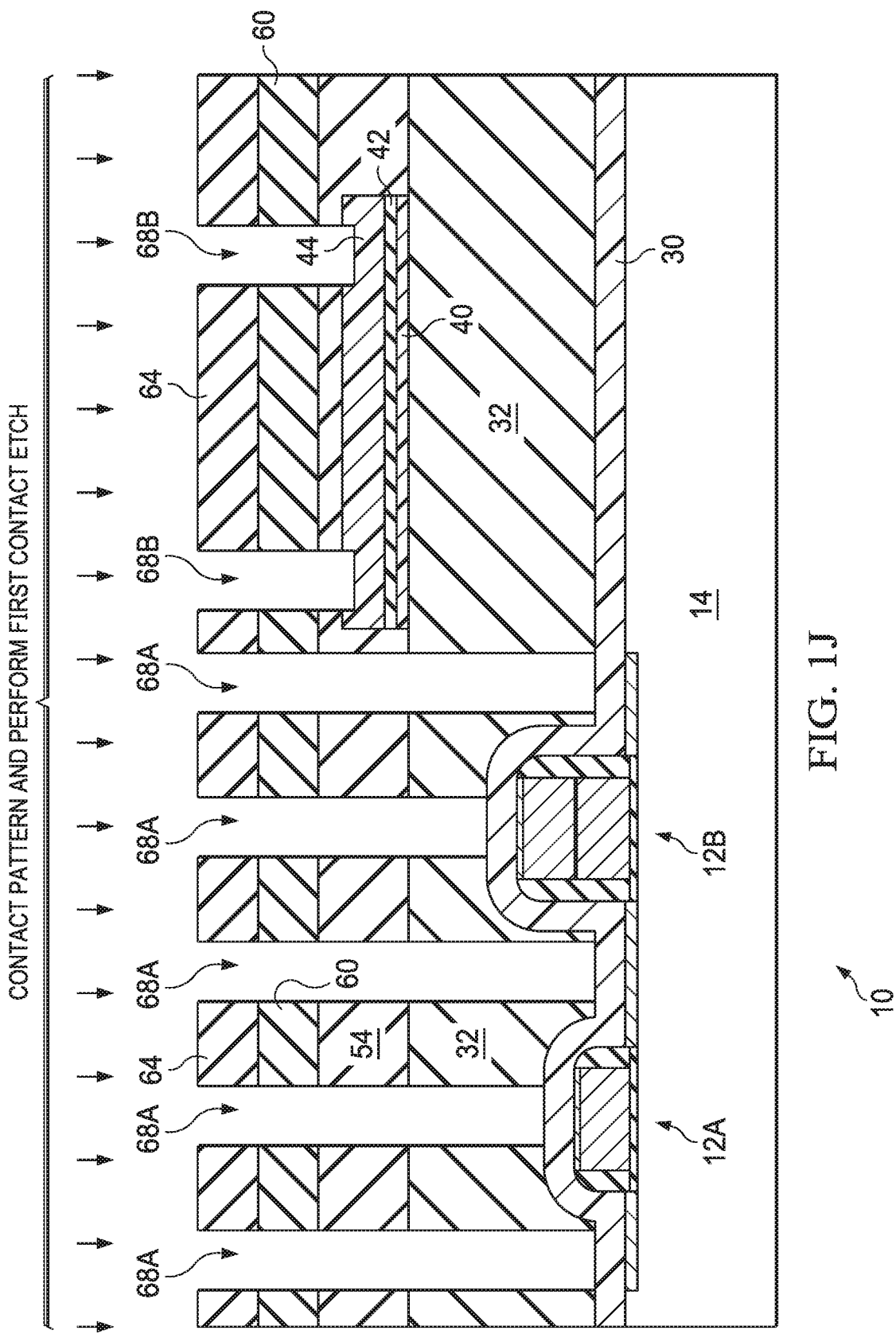

As shown in FIG. 1J, a contact photomask 64 may be deposited and patterned, followed by an etch process for creating openings for forming conductive contacts to IC elements 12A and 12B and TFR film layer 42. The etch process for creating contact openings is referred to herein as a "contact etch" process. In some embodiments, the contact etch process may include a sequence of multiple contact etches, e.g., using different etching chemistries or other etch parameters for each etch. In the illustrated embodiment, the contact etch process includes a first contact etch followed by a second contact etch.

As shown in FIG. 1J, a first contact etch is performed to at least partially etch all contact openings (e.g., trenches or vias) simultaneously, including first contact openings 68A laterally aligned over targeted structures of IC elements 12A and 12B (including silicide pads 20), and second contact openings 68B laterally aligned over the remaining portion of TFR film layer 42. In some embodiments, first contact etch stop layer 30 and second contact etch stop layer 44 (e.g., nitride etch stop layers) may slow the etch progression above the respective underlying layers, based on the etch selectivity of each respective layer. In some embodiments, as shown in FIG. 1J, the second contact openings 68B may extend a partial distance into second contact etch stop layer 44 while the etching of first contact openings 68A continues down to first contact etch stop layer 30. The first etch may stop once the top surface of first contact etch stop layer 30 is exposed, or alternatively etching through a portion of first contact etch stop layer 30.

Figure 1K:
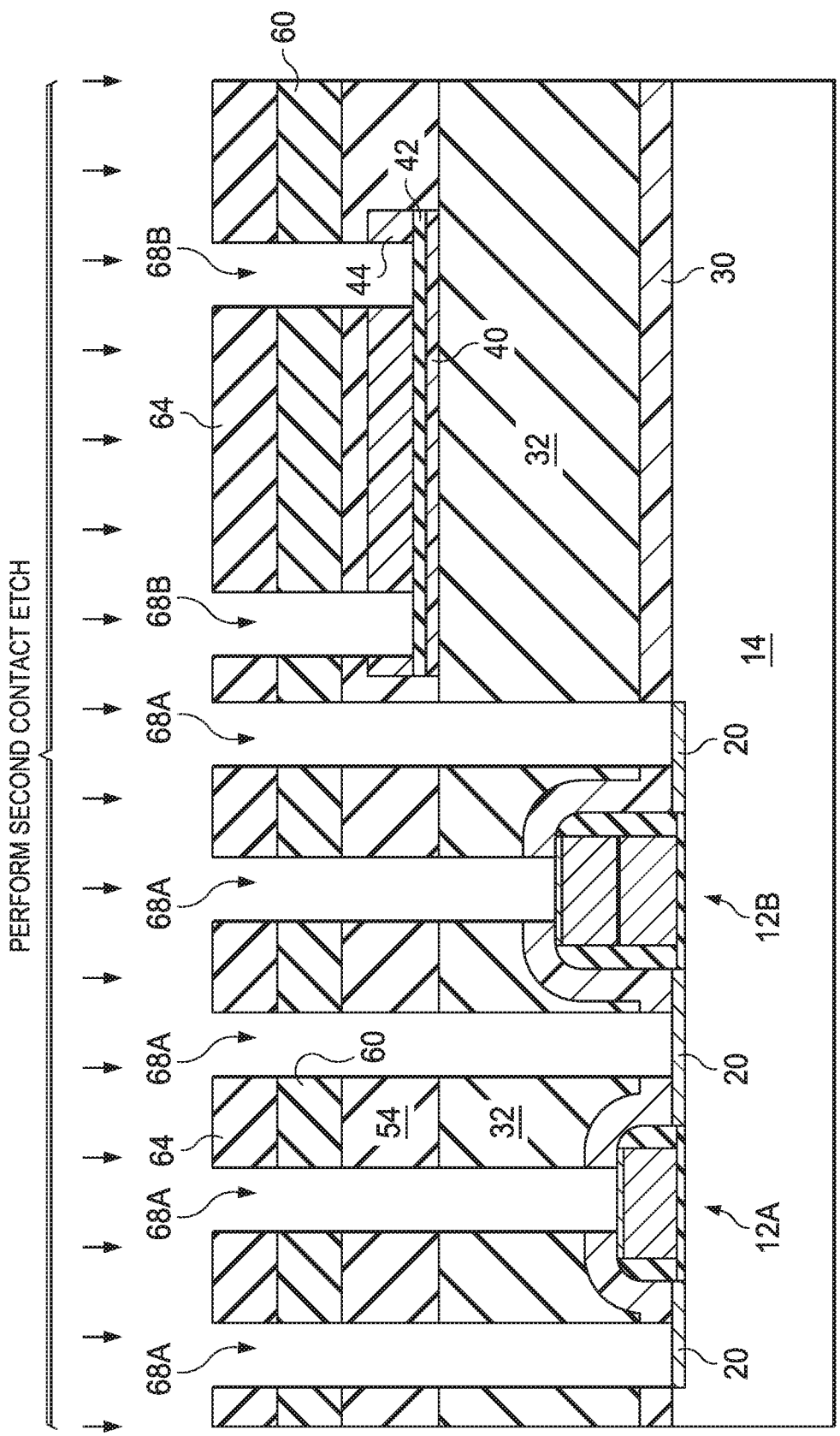

As shown in FIG. 1K, after the first contact etch is performed, a second contact etch may be performed, using a different etch chemistry than the first contact etch shown in FIG. 1J, to selectively etch first contact etch stop layer 30 and second contact etch stop layer 44. The etched structures (e.g., the composition and thickness of the various layers in the IC structure 10) and the chemistry and etch parameters of the second contact etch may be selected and tuned such that the etch exposes all targeted features, e.g., the remaining portion of TFR film layer 42 and the silicide contact pads 20 of the memory elements 12A, 12B, simultaneously or approximately simultaneously.

Figure 1L:
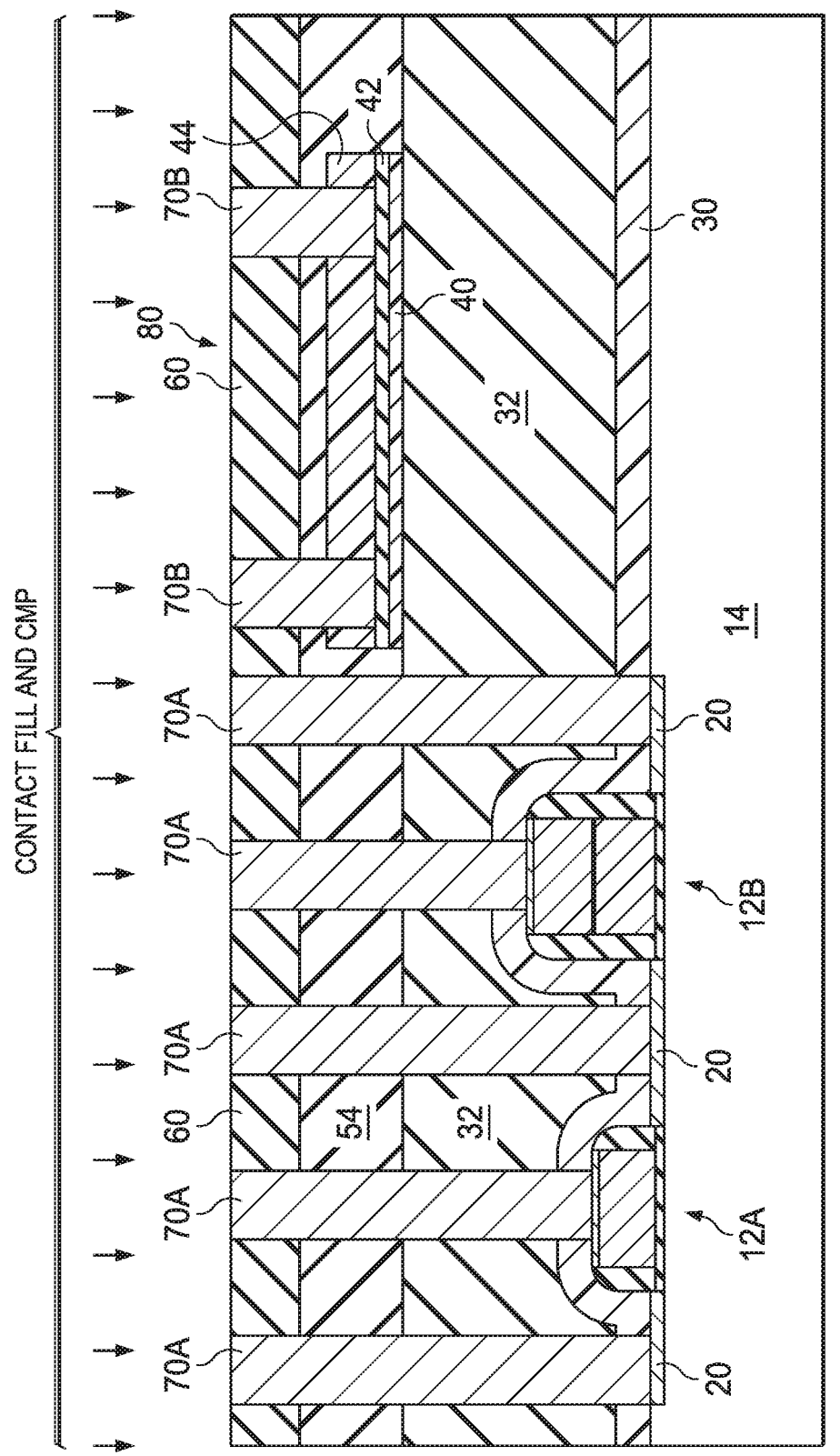

As shown in FIG. 1L, mask 64 may be removed, and conductive contacts 70A and 70B may be formed by depositing a conductive material (e.g., tungsten or other metal) in the etched contact openings (e.g., trenches or vias). A CMP may then be performed to planarize the top of the IC structure 10. As shown, conductive contacts 70A may land on, or otherwise contact to, silicide contact pads 20 of memory elements 12A, 12B, while TFR conductive contacts 70B may land on, or otherwise contact to, respective locations of TFR film layer 42. The formation of two TFR conductive contacts 70B in conductive contact with TFR film layer 42 at predetermined locations defines a TFR 80. A metal layer may then be formed over the structure shown in FIG. 1L, to form metal contacts to conductive contacts 70A and TFR conductive contacts 70B.

The disclosed process may allow for any metal interconnect flow common to semiconductors, e.g., AlCu, AlSiCu, or Cu trenches. Further, the TFR formation process can be integrated at different points in the manufacturing process to form a TFR 80 at any depth within the IC structure 10, e.g., in, above, or below any dielectric layer in IC structure 10. The example process shown in FIGS. 1A-1L illustrates the formation of an example TFR 80 between first and second dielectric layers 32 and 54.

Figure 2:
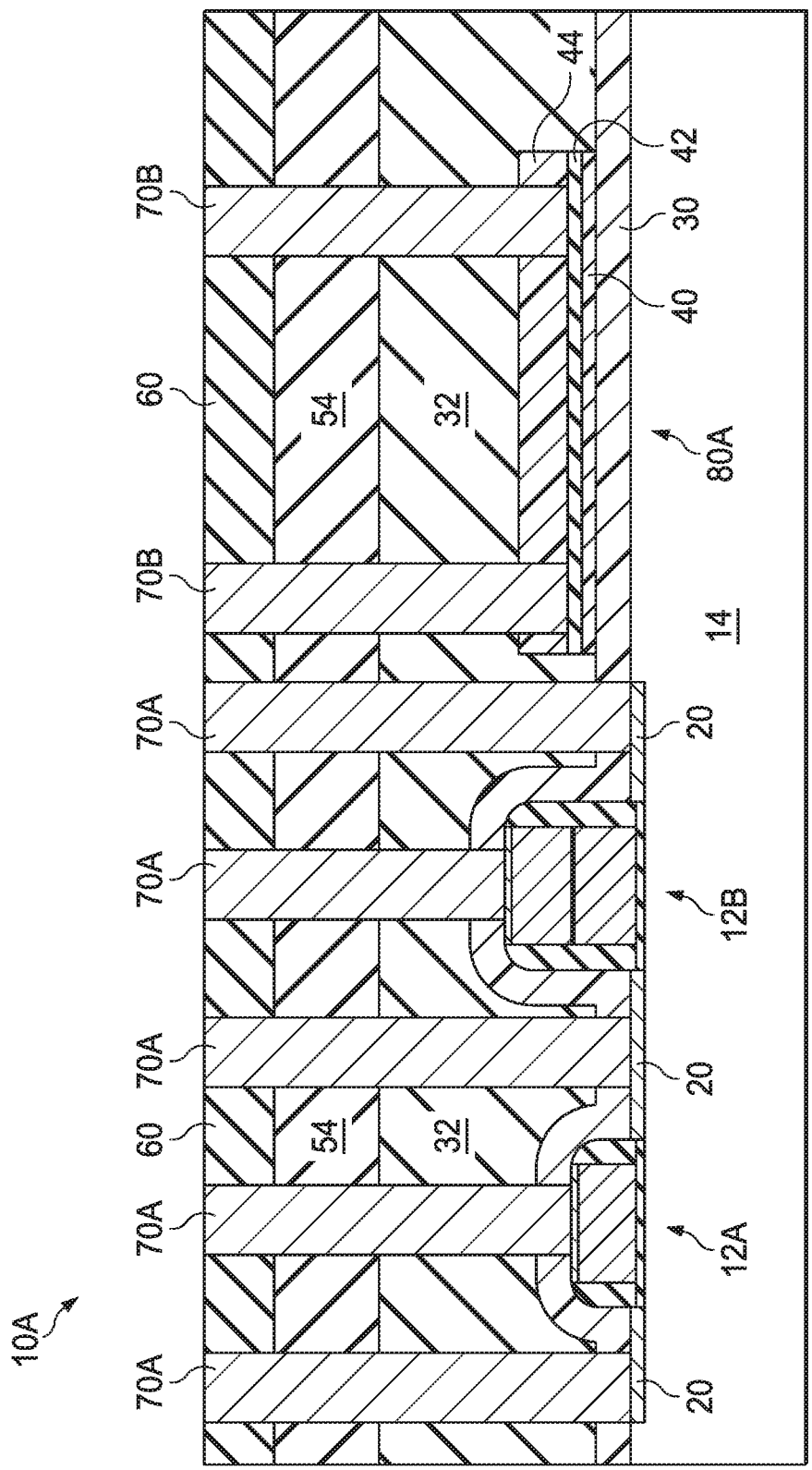
FIG. 2 shows another example embodiment of the present invention, in which a TFR is formed lower in the IC stack, directly on top of a first contact etch stop layer and a first dielectric layer.

FIG. 2 shows another example embodiment of the present invention, in which a TFR 80A is formed lower in the example IC structure 10A, in particular directly on top of the first contact etch stop layer 30, and below the first dielectric layer 32. TFR 80A may be formed by performing the steps shown in FIGS. 1C through 1F after forming first contact etch stop layer 30 and before depositing the first dielectric layer 32, and otherwise following the process shown in FIGS. 1G-1L, adjusted for the increased depth of TFR 80A.

Figure 3:
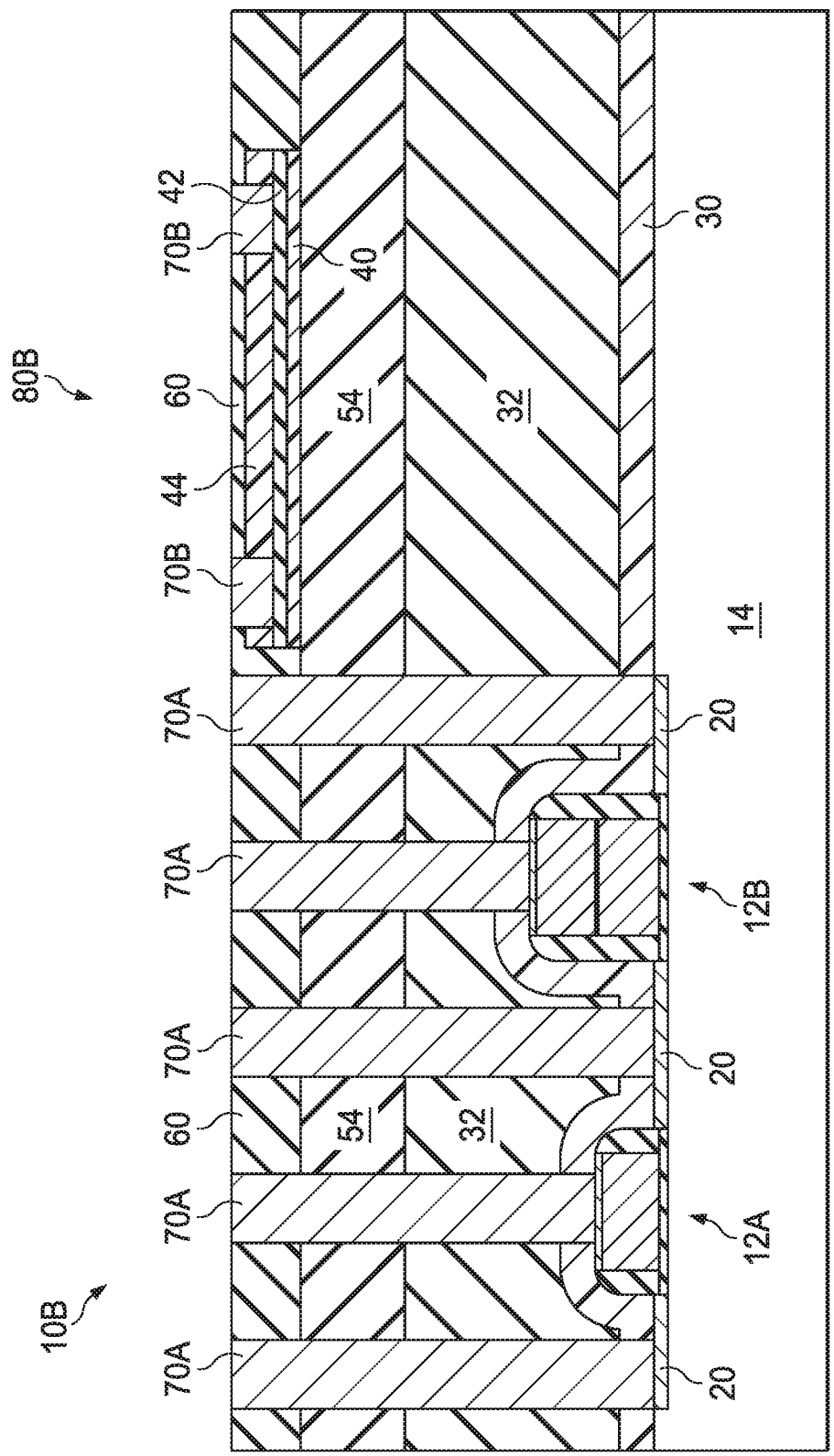
FIG. 3 shows another example embodiment of the present invention, in which a TFR is formed higher in the example IC structure, between second and third dielectric layers.

FIG. 3 shows yet another example embodiment of the present invention, in which a TFR 80B is formed higher in the example IC structure 10B, in particular between second dielectric layer 54 and a third dielectric layer 60. TFR 10B may be formed by performing the steps shown in FIGS. 1C through 1F after depositing the second dielectric layer 54, and otherwise following the process shown in FIGS. 1G-1L adjusted for the reduced depth of TFR 80B.

Thus, a TFR may be formed at any layer or depth in an IC structure according to the teachings disclosed herein.

As noted above, the second contact etch stop layer 44 formed over the TFR film 42 can be tuned to the relevant process or integration requirements. Each of the first contact etch stop layer 30 and the second contact etch stop layer 44 may be formed from any suitable material or materials, including for example, (a) SiN, (b) $Si_3N_4$, (c) SiON, (d) any other form of $Si_xO_yN_z$ where each of x, y, and z can be 0, 1, 2, 3, 4 or any other value, (e) any other dielectric nitride layer, (f) $SiO_2$, (g) $SiO_x$ where x<2, (h) SiC, or (i) any other material suitable for providing an etch stop function. In some embodiments, the second contact etch stop layer 44 has the same composition as the first contact etch stop layer 30. For example, in some embodiments, both the first and second contact etch stop layers 30 and 44 may comprise SiN. In other embodiments, the second contact etch stop layer 44 may have a different composition as the first contact etch stop layer 30. For example, the first contact etch stop layer 30 or second contact etch stop layer 44 may comprise SiN, while the other may comprise SiC or SiON.

If both the first contact etch stop layer 30 and second contact etch stop layer 44 are formed from the same material, they will have the same etch rate relative to the contact etch chemistry and would thus also have the same etch rate selectivity to any dielectric layers in the IC structure 10 (e.g., dielectric layers 32, 54, and 60). Thus, the thickness of the second contact etch stop layer 44 may be selected, based on the depth of the TFR 80/80A/80B in the IC structure 10 and the etch selectivity between the second contact etch stop layer 44 and the dielectric layers (e.g., layers 32, 54, 60), such that the thickness of the second contact etch stop layer 44 remaining after etching the dielectric layers (e.g., after the first etch shown in FIG. 1J and discussed above) is equal or approximately equal (e.g., within 25%) to the thickness of the first contact etch stop layer 30. Thus, the second etch to etch through the first contact etch stop layer 30 and second contact etch stop layer 44 will remove any of these layers and expose the underlying structures (silicide contact pads 20 and TFR film layer 42) at the same or approximately the same time.

In such embodiments, i.e., where the first contact etch stop layer 30 and second contact etch stop layer 44 are formed from the same material, and wherein the second contact etch stop layer 44 is partially reduced by the first etch shown in FIG. 1J, the second contact etch stop layer 44 may be formed with a larger thickness than the first contact etch stop layer 30, such that the thickness of the partially reduced second contact etch stop layer 44 matches that of the first contact etch stop layer 30. For example, in some embodiments, the formed thickness of the second contact etch stop layer 44 may be 10-100% than the first contact etch stop layer 30. In particular embodiments, the formed thickness of the second contact etch stop layer 44 may be 30-100% greater than the first contact etch stop layer 30.

In other embodiments, the first contact etch stop layer 30 and second contact etch stop layer 44 may have different compositions, and thus different etch rates and/or selectivities. For example, the first contact etch stop layer 30 or second contact etch stop layer 44 may comprise SiN, while the other may comprise SiC or SiON. In such embodiments, the thickness of the second contact etch stop layer 44 may be selected to allow for simultaneous removal of the first contact etch stop layer 30 and second contact etch stop layer 44. This flexibility allows for a single contact mask and etch integration. It also allows for the TFR to be formed at different depths in the IC structure.

The invention claimed is:

1. A method of forming an integrated circuit (IC) structure including a thin film resistor (TFR), the method comprising:
    forming at least one IC memory element over a semiconductor substrate, the at least one IC memory element having at least one IC memory element contact region;
    forming a first contact etch stop layer over the at least one IC memory element;
    forming a TFR layer stack in a pre-metal dielectric region above the first contact etch stop layer and laterally offset from the at least one IC memory element contact region, wherein forming the TFR layer stack includes:
        forming a TFR film layer, and
        forming a second contact etch stop layer over the TFR film layer;
    furnace annealing the TFR film layer to tune a temperature coefficient of resistance (TCR) value of the TFR film layer toward zero;
    forming a patterned mask including at least one first mask opening aligned over the at least one IC memory element contact region and at least one second mask opening aligned over the TFR layer stack;
    performing at least one etch through the first and second mask openings and through portions of the IC structure, including through both the first contact etch stop layer and the second contact etch stop layer, to simultaneously form (a) at least one first contact opening that exposes the at least one IC memory element contact region and (b) at least one second contact opening that exposes the TFR film layer; and
    filling the at least one first contact opening and the at least one second contact opening with conductive material to form at least one conductive contact to the at least one IC memory element and at least one conductive contact to the TFR film layer.

2. The method of claim 1, wherein:
    forming the TFR layer stack in the pre-metal dielectric region comprises depositing a dielectric layer over the at least one IC memory element and over the first contact etch stop layer; and
    the TFR layer stack is formed over the deposited dielectric layer.

3. The method of claim 1, wherein:
    forming the TFR layer stack in the pre-metal dielectric region comprises depositing multiple dielectric layers over the at least one IC memory element and over the first contact etch stop layer; and
    the TFR layer stack is formed over the multiple dielectric layers.

4. The method of claim 1, wherein forming the TFR layer stack in the pre-metal dielectric region comprises depositing at least one dielectric layer over the TFR layer stack.

5. The method of claim 1, wherein the forming of the TFR layer stack is directly on the first contact etch stop layer.

6. The method of claim 1, wherein the first contact etch stop layer and the second contact etch stop layer are formed from the same material.

7. The method of claim 1, wherein the first contact etch stop layer and the second contact etch stop layer are each formed from SiN or other dielectric nitride.

8. The method of claim 1, wherein the second contact etch stop layer has a greater thickness than the first contact etch stop layer.

9. The method of claim 1, wherein the performing at least one etch to simultaneously form (a) at least one first contact opening that exposes the IC memory element contact region and (b) at least one second contact opening that exposes the TFR film layer comprises:
    performing a first etch that exposes the first contact etch stop layer and the second contact etch stop layer; and
    performing a second etch that extends through the first contact etch stop layer and second contact etch stop layer to expose the at least one IC memory element contact region and the TFR film layer.

10. The method of claim 1, wherein the forming of the TFR layer stack further includes:
    forming a TFR etch stop layer,
    wherein forming the TFR film layer is over the formed TFR etch stop layer.

11. The method of claim 1, comprising forming and annealing the TFR film layer prior to forming a first metal layer on the IC structure.

12. A method of forming a thin film resistor (TFR), the method comprising:

forming a memory element over a semiconductor substrate;

forming a first contact etch stop layer above the memory element;

forming a TFR film layer above the first contact etch stop layer;

furnace annealing the TFR film layer to tune a temperature coefficient of resistance (TCR) value of the TFR film layer toward zero;

forming a second contact etch stop layer over the TFR film layer, wherein the TFR film layer and the second contact etch stop layer are laterally offset from the contact pad;

forming a patterned mask having a first mask opening aligned over the memory element and at least one second mask opening aligned over the TFR film layer;

performing at least one etch through the first and second mask openings and through both the first contact etch stop layer and the second contact etch stop layer to form both (a) a first contact opening that exposes the memory element or a conductive contact region connected to the memory element and (b) at least one second contact opening that exposes the TFR film layer; and filling the first contact opening and the at least one second contact opening with conductive material to form a first vertically-extending contact connected to the memory element or to the conductive contact region and at least one second vertically-extending contact connected to the TFR film layer.

13. The method of claim 12, further comprising:

forming an IC memory element over the semiconductor substrate, wherein the conductive contact region provides a conductive coupling to the memory element; and depositing at least one dielectric layer over the memory element, the memory element, and the first contact etch stop layer, wherein the TFR film layer is formed over the at least one dielectric layer.

14. The method of claim 12, further comprising forming a TFR layer stack directly on the first contact etch stop layer by:

forming a TFR etch stop layer directly on the first contact etch stop layer, wherein said forming the TFR film layer is over the TFR etch stop layer.

15. The method of claim 12, wherein the first contact etch stop layer and the second contact etch stop layer are formed from the same material.

16. The method of claim 12, wherein the first contact etch stop layer and the second contact etch stop layer are each formed from SiN or other dielectric nitride.

17. The method of claim 12, wherein the second contact etch stop layer has a greater thickness than the first contact etch stop layer.

18. The method of claim 12, wherein the performing of at least one etch through the first and second mask openings and through both the first contact etch stop layer and the second contact etch stop layer to form both (a) a first contact opening that exposes the memory element or the conductive contact region connected to the memory element and (b) at least one second contact opening that exposes the TFR film layer comprises:

performing a first etch that stops at the first contact etch stop layer and the second contact etch stop layer; and performing a second etch that extends through the first contact etch stop layer and second contact etch stop layer to expose the memory element or conductive contact region connected to the memory element, and the TFR film layer.

19. The method of claim 12, comprising forming and annealing the TFR film layer prior to forming a first metal layer on the IC structure.

* * * * *